United States Patent [19]

Ninane et al.

[11] Patent Number: 5,396,863

[45] Date of Patent: Mar. 14, 1995

[54] INSTALLATION AND PROCESS FOR THE CRYSTALLIZATION OF AN INORGANIC SUBSTANCE AND PROCESS AND INSTALLATION FOR THE CRYSTALLIZATION OF SODIUM CARBONATE MONOHYDRATE

[75] Inventors: Léon Ninane; Claude Breton, both of Dombasle-sur-Meurthe, France

[73] Assignee: Solvay (Société Anonyme), Brussels, Belgium

[21] Appl. No.: 29,423

[22] Filed: Mar. 9, 1993

[30] Foreign Application Priority Data

Mar. 25, 1992 [FR] France ................. 92 03698

[51] Int. Cl.⁶ ............................................. C30B 7/04
[52] U.S. Cl. ........................... 117/206; 117/200; 117/202; 117/204
[58] Field of Search ........... 156/DIG. 88; 423/302 T; 422/245, 250, 251, 252, 254

[56] References Cited

U.S. PATENT DOCUMENTS

| | | | |
|---|---|---|---|
| 2,034,969 | 3/1936 | Behrens | 422/245 |
| 3,236,590 | 2/1966 | Sopchak et al. | 23/63 |
| 3,314,748 | 4/1967 | Howard et al. | 23/63 |
| 3,529,938 | 9/1970 | Yoon et al. | 422/245 |
| 3,865,922 | 2/1975 | Boontje | 423/166 |
| 4,022,820 | 5/1977 | Johnson | 260/475 B |
| 4,144,308 | 3/1979 | Johnson | 422/245 |
| 4,588,562 | 5/1986 | Saitoh et al. | 422/245 |
| 4,806,318 | 2/1989 | Saitoh et al. | 422/251 |
| 5,143,543 | 9/1992 | Reid et al. | 75/744 |

FOREIGN PATENT DOCUMENTS

| | | |
|---|---|---|
| 661071 | 3/1965 | Belgium . |
| 73085 | 3/1983 | European Pat. Off. . |
| 0004401 | 1/1984 | Japan ................. 422/254 |

OTHER PUBLICATIONS

Kirk–Othmer Encyclopedia of Chemical Technology Third Edition, vol. 15, "Matches to N–Nitrosamines".
Kirk–Othmer Encyclopedia of Chemical Technology Third Edition, vol. 7, "Copper Alloys to Distillation".
American Chemical Society Monograph Series, Second Edition, 1969, Te-Pang Hou: "Manufacture of Soda".

Primary Examiner—R. Bruce Breneman
Assistant Examiner—Felisa Garrett
Attorney, Agent, or Firm—Spencer, Frank & Schneider

[57] ABSTRACT

Installation for the crystallization of an inorganic substance in a crystal slurry, by desupersaturation of a supersaturated solution, the installation comprising a crystallization chamber which has a vertical axis and is divided into a central zone (4) and an annular zone (5), a device (9, 10) designed to bring about a vertical translation of the slurry in the central zone (4) and a translation in the opposite direction in the annular zone (5), a device (8) for withdrawing slurry, comprising a tube (23, 24) which opens into one of the abovementioned zones, a member (14) for mechanical shearing of the slurry, comprising, a disc (17) carrying a ring of shearing teeth (19), and a tube (6, 31) passing through the cover (30) and serving to introduce anhydrous sodium carbonate, the tube (31) having a prolongation inside the crystallization chamber, over which prolongation a film of water is caused to circulate.

18 Claims, 4 Drawing Sheets

INSTALLATION AND PROCESS FOR THE CRYSTALLIZATION OF AN INORGANIC SUBSTANCE AND PROCESS AND INSTALLATION FOR THE CRYSTALLIZATION OF SODIUM CARBONATE MONOHYDRATE

The invention relates to the crystallisation of inorganic substances.

It relates in particular to an installation designed for the crystallisation of an inorganic substance.

Known crystallisation installations comprise a crystallisation chamber and a device designed to produce, within the chamber, circulation of a slurry consisting of a dispersion of crystals in a solution saturated with the material to be crystallised. In using these known installations, the slurry is the site of crystallisation of the solution by supersaturation-desupersaturation, and is furthermore subjected to permanent circulation within the crystallisation chamber. Crystallisation installations of this type are used for the crystallisation of sodium carbonate monohydrate, starting from anhydrous sodium carbonate [Belgian Patent A-661071 (ALLIED CHEMICAL CORP.) and European Patent B-073085 (SOLVAY)].

A difficulty encountered in using these known crystallisation installations resides in the difficulty of controlling the particle size of the crystals produced.

The invention overcomes this difficulty by providing a crystallisation installation of novel conception, which makes it possible to regulate, as desired and in a precise manner, the particle size characteristics of the crystals produced.

Accordingly, the invention relates to an installation for the crystallisation of an inorganic substance in a crystal slurry, by desupersaturation of a supersaturated solution, the installation comprising a crystallisation chamber and a device designed for achieving circulation of the slurry in the crystallisation chamber; according to the invention, the crystallisation chamber contains a member for the mechanical shearing of the slurry, comprising a disc provided with a ring of shearing teeth on its periphery.

In the installation according to the invention, the crystallisation chamber can have any appropriate shape. It is advantageous to use a chamber of revolution, preferably having a vertical axis, for example a cylindrical, conical or frustoconical chamber.

The term crystal slurry as intended to denote a suspension of crystals of an inorganic material in an aqueous or organic solution supersaturated with the substance to be crystallised. The inorganic material forming the crystals of the slurry can, as desired, be identical to, or different from, the inorganic substance to be crystallised. The said material is usually identical to the inorganic substance to be crystallised.

The device for bringing about circulation of the slurry in the crystallisation chamber is not critical and can for example comprise one or more helices, a turbine or one or more fluid ejectors. The use of a helix or of an assembly of helices is preferred. Examples of helices which can be used in the installation according to the invention are in particular described in Kirk-Othmer, Encyclopedia of Chemical Technology, 3rd Edition, Vol. 15, 1981, pages 607 to 611.

The member for mechanical shearing of the slurry is an apparatus intended to subject the slurry to a shearing stress which forces two contiguous veins of the slurry to move relative to one another along a shared surface. According to the invention, the shearing member comprises a disc provided with a ring of shearing teeth on its periphery.

In the installation according to the invention, the ring of teeth of the disc serves the function of generating a shearing stress in the slurry under the rotational action of the disc. The teeth can have any profile compatible with the shearing function. They are preferably profiled in such a manner as to avoid them causing an overall radial or axial movement (relative to the axis of the disc) of the slurry. To this effect, according to a particular embodiment, the shearing teeth are arranged symmetrically on either side of the disc and advantageously point at right angles to the plane of the disc. The teeth can for example have a profile similar to that of the teeth of a saw and can be produced by appropriate cutting and bending of the peripheral zone of the disc.

All other matters being equal, the magnitude of the shearing stress will depend on the relative positions of the circulation device and the shearing disc. According to a particular embodiment of the installation according to the invention, it is preferred to arrange the disc in the crystallisation chamber in such a manner that during normal operation of the installation the speed of circulation of the crystal slurry in the crystallisation chamber exhibits a component tangential to the disc. It is preferred to have a position of the disc in which the said tangential component is at least equal to, and preferably greater than, the speed component normal to the disc, with a tangential component at least equal to twice the normal component being recommended.

As a variant, the shearing member can comprise two or more shearing discs such as those described above, mounted on the same rotary shaft or on different rotary shafts.

During normal operation of the installation according to the invention, the reaction chamber contains a crystal slurry as defined above and the whole of the slurry is subjected to permanent circulation within the chamber, in contact with the disc. Under the effect of the rotation of the disc, the ring of teeth subjects the slurry to a local shearing stress whose magnitude can be regulated as desired by changing the speed of rotation of the disc. The shearing stress has the effect of causing local desupersaturation of the supersaturated solution, leading to the spontaneous formation of a large number of seeds of small size. The magnitude of the number of seeds produced under the shearing effect depends on the intensity of the shearing stress and determines the mean diameter of the crystals produced in the crystallisation chamber. The intensity of the shearing stress exerted on the slurry will furthermore depend on the rate of circulation of the slurry in the crystallisation chamber, on the number of shearing teeth of the disc, on the profile and dimensions of the teeth and on the speed of rotation of the disc.

The shearing stress can furthermore cause a breaking-up of the crystals of the slurry.

In a preferred embodiment of the installation according to the invention, the crystallisation chamber is delimited by a vertical cylindrical enclosure and is divided into a central zone and an annular zone by a cylindrical chimney arranged axially in the enclosure and open at its upper and lower ends; in this embodiment of the installation, the circulation device is so designed that the said circulation of the slurry in the crystallisation chamber comprises a vertical translation in the central zone and a vertical translation of opposite direction in the annular zone. In this embodiment of the installation, it is preferred to employ descending translation of the slurry in the central zone and ascending translation in the annular zone. An installation of this type is in particular described in European Patent B-073085 (SOLVAY). In an advantageous variant of this embodiment of the installation according to the invention, the device for the circulation of the slurry comprises an axial-flow helix which is arranged in the central zone, preferably in the lower part thereof, whilst the shearing disc is arranged below the chimney and has its axis of rotation arranged inclined to, or perpendicular to, the axis of rotation of the helix. In this variant of the invention, the lower part of the central zone is the part of this zone which extends over the lower half of the height of the chimney, preferably the lower third of the height of the chimney.

In the embodiment, just described, of the installation according to the invention, crystal agglomerates may tend to format the wrong time and in an uncontrolled manner, and to settle out in the bottom of the crystallisation chamber. These agglomerates can give rise to difficulties when withdrawing the slurry.

With this in mind, in a particular form of execution of the embodiment which has just been described, a device for withdrawing the slurry comprises a tube which opens into one of the abovementioned zones.

In this form of execution of the invention, the arrangement of the tube in the crystallisation chamber is not critical provided that it opens, at one end, into the central zone or the annular zone, the other end of the tube being outside the crystallisation chamber. The area of the central zone or annular zone into which the tube opens is preferably located in the middle part of the said zone. By middle part of the central zone or of the annular zone there is to be understood the part thereof which is located between the lower third and the upper third of the height of the chimney. It is advantageous if the tube opens into the upper half of the aforesaid middle part.

In a preferred variant of the abovementioned embodiment of the installation according to the invention, the zone into which the tube opens is the central zone. In this variant of the invention, it is advantageous to have the tube opening in the immediate vicinity of the chimney. To this effect, the tube can run in the annular zone of the crystallisation chamber and pass through the chimney. In this variant of the invention, the tube preferably occupies a vertical position in the annular zone and emerges therefrom by passing through the enclosure in the bottom, or near the bottom, of the crystallisation chamber.

The installation according to the invention is suitable for all crystallisation processes in which a material crystallises within a crystal slurry, by desupersaturation of a supersaturated solution of the substance to be crystallised.

Accordingly, the invention also relates to a process for the crystallisation of an inorganic substance, according to which a slurry of crystals in a supersaturated solution of the substance to be crystallised is used, the slurry is subjected to circulation in a crystallisation installation according to the invention, the inorganic substance is crystallised by desupersaturation of the solution, and at least a fraction of the slurry is withdrawn from the installation.

In the process according to the invention, the crystallisation mechanism is the result of desupersaturation of the supersaturated solution. The latter can be obtained, for example, by chemical reaction, by cooling, by heating, or by evaporation.

The process according to the invention finds a valuable application in the crystallisation of sodium carbonate monohydrate, starting from anhydrous sodium carbonate.

In an embodiment of this application of the invention, a slurry consisting of crystals of sodium carbonate monohydrate in a saturated aqueous solution of sodium carbonate monohydrate is employed and the sodium carbonate monohydrate solution is supersaturated by introducing anhydrous sodium carbonate into it.

In this embodiment of the process according to the invention, the origin of the anhydrous sodium carbonate is not critical. Advantageously, light anhydrous sodium carbonate crystals resulting from the calcination of sodium bicarbonate obtained by the ammonia process are used.

The slurry of sodium carbonate monohydrate crystals can be obtained in various ways. For example, it can originate from a source external to the process or can be obtained by partial evaporation of an aqueous sodium carbonate solution. In general, it is advantageous to regulate the concentration of the sodium carbonate monohydrate slurry so that it contains between 20 and 60%, preferably between 30 and 55%, by weight of sodium carbonate monohydrate crystals.

The temperature of the slurry, whilst carrying out the process, must be kept below the temperature of transition of sodium carbonate monohydrate to anhydrous sodium carbonate. The optimum temperature depends on various factors, especially the concentration of the slurry and the particle size of the sodium carbonate monohydrate crystals which it contains, as well as the particle size and morphology of the anhydrous sodium carbonate employed. It can be determined, in each particular case, by routine laboratory work. As a general rule, the temperature chosen is such that it is between about 2° and about 25° C., preferably less than 15° C., away from the abovementioned transition temperature, the best results being obtained when it is between 3° and 10° C. away from the said temperature.

The anhydrous sodium carbonate can be at ambient temperature. However, according to an advantageous embodiment of the process according to the invention, it is preferred to employ hot anhydrous sodium carbonate which is preferably at a temperature at least equal to the temperature of the crystal slurry.

In the crystallisation chamber, the crystal slurry is subjected to internal circulation so as to facilitate and accelerate the incorporation of the anhydrous sodium carbonate introduced into the said chamber.

In the embodiment, just described, of the process according to the invention, the anhydrous sodium carbonate dissolves in the aqueous solution of the slurry and thus supersaturates it in respect of sodium carbonate monohydrate, and sodium carbonate monohydrate crystallises by desupersaturation of the solution.

This embodiment of the process according to the invention can advantageously be carried out in an installation of the type described in Belgian Patent A-661071. To this effect, there is used a crystallisation chamber comprising a side wall, a bottom and a cover, the slurry of sodium carbonate monohydrate crystals is circulated in the crystallisation chamber, and the anhydrous sodium carbonate is introduced in the form of a powder into the crystallisation chamber, via a tube passing through the cover of the crystallisation chamber. In this embodiment of the process according to the invention, the crystallisation chamber can have any appropriate shape. Advantageously, a chamber of revolution, preferably with a vertical axis, is used. Where appropriate, the side wall can, for example, have a cylindrical or frustoconical profile, the bottom can have a conical, frustoconical or hemispherical profile, and the cover can have a plane, conical, frustoconical or hemispherical profile. The tube used for the introduction of the anhydrous sodium carbonate passes through the cover, preferably axially.

In an advantageous variant of this embodiment of the process according to the invention, the tube used for introduction of the anhydrous sodium carbonate has a prolongation inside the crystallisation chamber and a film of water is made to circulate over the external face of the wall of the said prolongation of the tube (the external face of the wall of the tube being, by definition, the face of the said wall which is located on the outside of the tube, contrary to the face located inside the tube). The film of water can advantageously be obtained by condensing water vapour, present in the crystallisation chamber, on the abovementioned face of the prolongation of the tube. To this effect, the wall of the abovementioned prolongation of the tube can be hollow and can include an annular chamber through which flows a cooling fluid, for example cold water.

In this variant of the process according to the invention, the prolongation of the tube inside the crystallisation chamber serves the function of optimising the introduction of the anhydrous sodium carbonate into the slurry, so as to give a homogeneous dispersion of the anhydrous sodium carbonate in the slurry. The optimum length of the prolongation of the tube depends on the geometry of the crystallisation chamber (especially on its profile and its dimensions) and on the conditions of use (especially the level which the slurry normally reaches during normal use of the crystallisation chamber). In practice, the tube opens into the crystallisation chamber above the level of the slurry, the ratio of the length of the said prolongation to the height of the crystallisation chamber above the said level being, for example, between 0.1 and 0.9, particularly recommended ratios being those greater than 0.2, preferably 0.3, and less than 0.8, preferably 0.7. The film of water which is caused to circulate over the external face of the prolongation of the tube serves to dissolve the sodium carbonate particles which may just have been thrown against the said external face of the tube. In this way, the formation of particle agglomerates adhering to the said wall is avoided. The film of water must accordingly be employed in an amount which is at least sufficient to dissolve instantly the sodium carbonate particles which are thrown against the said face of the wall of the tube.

Special features and details of the invention will emerge from the description of the attached drawings which now follows.

FIG. 1 diagrammatically shows, in axial vertical section, a first particular embodiment of the installation according to the invention;

In these figures, the same reference numerals denote identical components.

Figure 1:
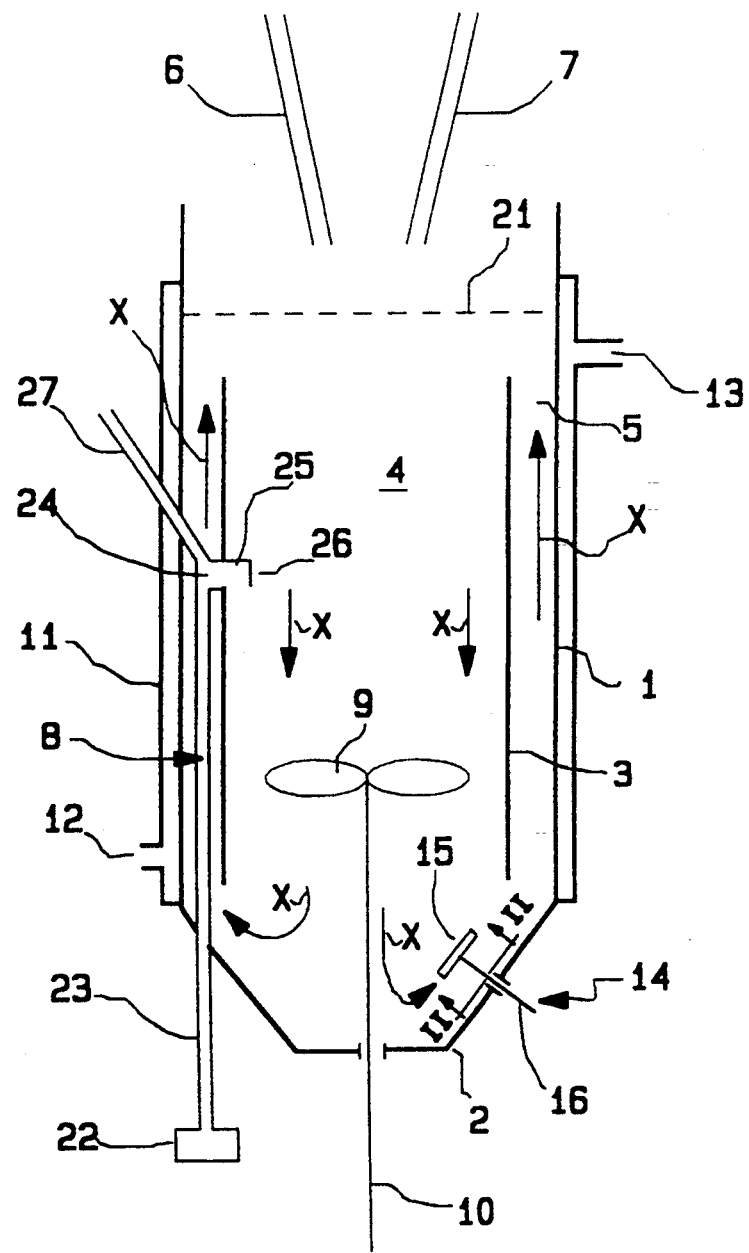

The installation shown in FIG. 1 is of the type described in Kirk-Othmer, Encyclopedia of Chemical Technology, 3rd Edition, Vol. 7, 1979, pages 264–265 and FIG. 13. It comprises a crystallisation chamber delimited by a vertical cylindrical enclosure 1 and a frustoconical base 2. A vertical cylindrical chimney 3 is arranged axially in the crystallisation chamber and thus divides the latter into a central zone 4 and an annular zone 5. Pipelines 6 and 7 serve for the introduction of the materials involved in the crystallisation. A helix 9 mounted on a vertical shaft 10 is arranged in the lower third of the central zone 4. The helix 9 is of the axial flow type and serves to subject a crystal slurry, during use of the installation, to a circulation comprising a descending translation in the central zone 4 and an ascending translation in the annular zone 5. An example of an axial flow helix is shown in Kirk-Othmer, Encyclopedia of Chemical Technology, 3rd Edition, Vol. 15, 1981, page 611, FIG. 15. The enclosure 1 can be surrounded by a jacket 11 connected to an introduction pipeline 12 and a discharge pipeline 13 for a heat transfer fluid. A device, denoted in total by reference numeral 8 and described in the text which follows, serves to withdraw the crystal slurry intermittently or continuously from the crystallisation chamber. An opening (not shown) through the frustoconical base 2, normally closed by a valve serves, where necessary, for emptying the crystallisation chamber.

According to the invention, the crystallisation chamber contains, below the chimney 3, a member 14 designed to carry out mechanical shearing of a crystal slurry during use of the installation. The shearing member 14 comprises a wheel 15 mounted on a rotary shaft 16 passing through the frustoconical wall 2 of the crystallisation chamber.

Figure 3:
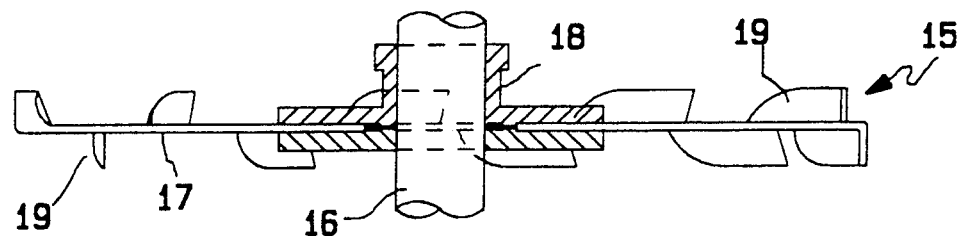
FIG. 3 is a view in section along plane III—III of FIG. 2.
Figure 2:
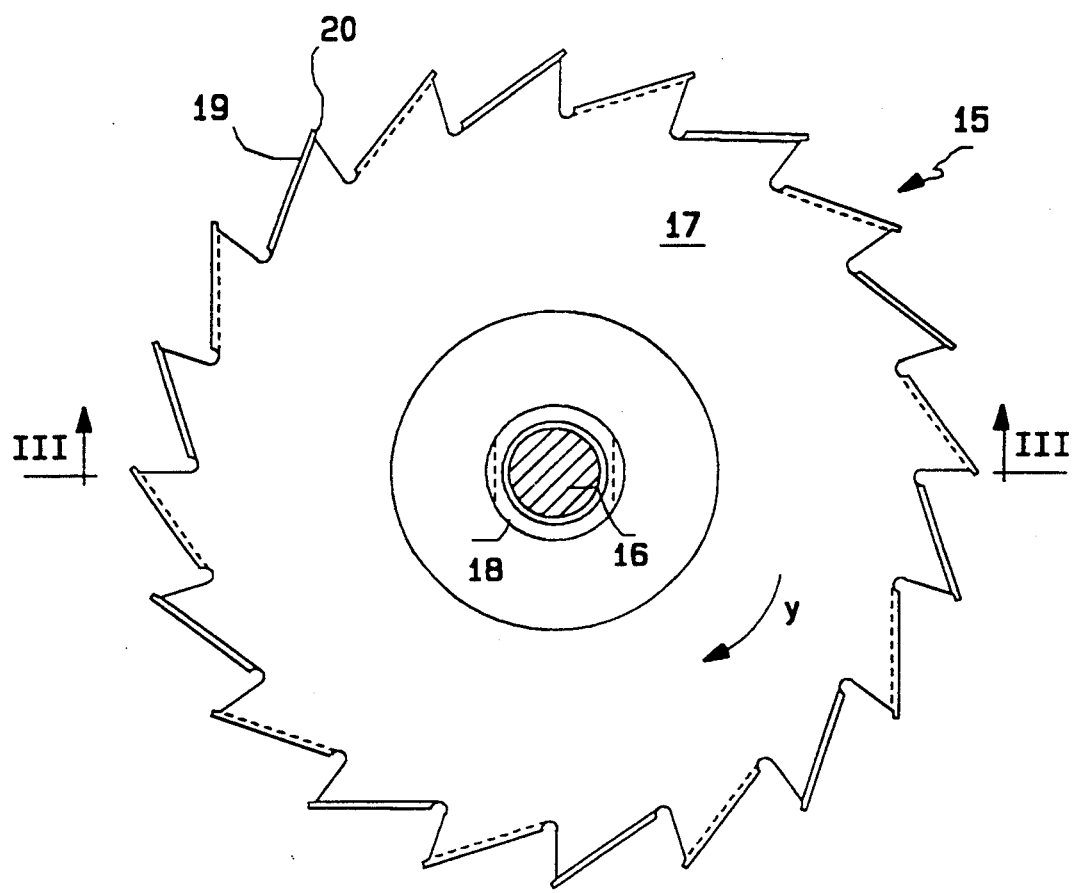
FIG. 2 shows, on a larger scale, a detail of FIG. 1 in section along plane II—II of FIG. 1.

The wheel 15 shown in greater detail in FIG. 2 and 3 comprises a metal disc 17 mounted on a ring 18 intended to fit as a sleeve on the shaft 16. On its periphery it carries a ring of shearing teeth 19. These are produced by appropriate bending and cutting of the peripheral zone of the disc 17, so that they have a frontal shearing edge 20 running at right angles to the disc 17. The shearing teeth 19 are furthermore arranged alternately and symmetrically on either side of the disc 17. The disc 17 is intended to revolve in the direction of the arrow Y during normal use of the installation, so that the shearing teeth 19 cause a mechanical shearing of a crystal slurry in the crystallisation chamber.

According to the invention, the position of the shearing wheel 15 in the crystallisation chamber is such that the speed of circulation of the crystal slurry comprises a component tangential to the disc 17. Thus, under the effect of the rotation of the disc in the direction of the arrow Y, the slurry undergoes a mechanical shearing in contact with the wheel 15.

In the installation represented in FIGS. 1 to 3, the shearing member comprises a single shearing wheel 15. As a variant, it can comprise a plurality of similar shearing wheels 15, fixed on the shaft 16. According to another variant, the installation can comprise a plurality of shearing members 14, that is to say a plurality of shearing wheels 15 mounted on different rotary shafts 16, which are distributed uniformly on the periphery of the frustoconical base 2 of the crystallisation chamber.

According to the invention, the withdrawal device 8 comprises a vertical tube 23 which runs vertically in the annular zone 5 of the crystallisation chamber and passes through the frustoconical base of the latter. The upper end 24 of the tube 23 is bent at a right angle and opens into the central zone 4 across an orifice 25 made for this purpose in the chimney 3, at approximately half the height of the latter. The end 24 of the tube is passed through the orifice 25 in a leak-tight manner, to avoid communication between the central zone 4 and the annular zone 5 via this orifice 25. A deflector 26 is furthermore fixed to the chimney 3, in the zone 4, facing the orifice 25. A degassing tube 27 passes through the enclosure 1 and the annular envelope 11 and opens into the upper end 24 of the tube 23. It is connected to a vacuum pump which is not shown and is located outside the crystallisation chamber. The lower end of the tube 23 is connected to a pump 22 which is located outside the crystallisation chamber and whose function will be explained later.

During operation of the installation, a fraction of the slurry is withdrawn via the device 8.

To this effect, the pump 22 generates a pressure reduction in the tube 23 and its end 24, which has the effect of drawing into these a fraction of the slurry circulating in the zone 4 in the vicinity of the orifice 25. The deflector 26 serves to channel the slurry passing from the zone 4 into the tube 23 and to avoid the formation of vortices at the inlet of the orifice 25. The magnitude of the slurry fraction which is thus withdrawn from the crystallisation chamber via the tube 23 is regulated as desired by regulating the pressure reduction generated by the pump 22. During operation of the installation, the respective throughputs of anhydrous sodium carbonate in the pipeline 6, of water (or of aqueous sodium carbonate solution) in the pipeline 7 and of crystal slurry in the extraction device 8 are regulated in such a way as to avoid variation of the slurry level 21 and to keep the concentration of sodium carbonate monohydrate crystals in the slurry substantially constant.

Withdrawing the slurry via the orifice 25 has the advantageous effect of avoiding the said orifice becoming blocked by crystal agglomerates. The latter in effect do not participate in the circulation of the slurry in the zones 4 and 5 but accumulate on the bottom 2 of the crystallisation chamber. They are periodically removed by complete emptying of the crystallisation chamber after stopping the installation. This emptying of the chamber may be for example through an opening (not shown) in the frustoconical base 2.

The installation represented in FIGS. 1 to 3 is in particular suitable for the production of sodium carbonate monohydrate crystals from anhydrous sodium carbonate. In this application of the installation, the crystallisation chamber is filled, substantially up to the level 21, with an aqueous slurry of sodium carbonate monohydrate crystals, the temperature of which is kept permanently a few degrees below the temperature of the transition of sodium carbonate monohydrate to anhydrous sodium carbonate. Anhydrous sodium carbonate is introduced into the crystallisation chamber via the pipeline 6. At the same time, water (or an aqueous sodium carbonate solution) is introduced into the crystallisation chamber via the pipeline 7. A fraction of the slurry is withdrawn via the device 8.

The respective throughputs of the anhydrous sodium carbonate in the pipeline 6, of the water (or the aqueous sodium carbonate solution) in pipeline 7 and of the crystal slurry in the withdrawal device 8 are regulated so as to avoid a variation in the slurry level 21 and to keep the concentration of sodium carbonate monohydrate crystals in the slurry substantially constant. Under the action of the rotation of the helix 9, the crystal slurry is subjected to permanent circulation in the crystallisation chamber, shown diagrammatically by the arrows X and comprising a descending translation in the central zone 4 and an ascending translation in the annular zone 5. During the circulation of the slurry in the crystallisation chamber, the anhydrous sodium carbonate recrystallises in the form of sodium carbonate monohydrate. The mechanical shearing produced by the wheel 15 brings about a local desupersaturation of the supersaturated aqueous solution of sodium carbonate monohydrate, causing the spontaneous formation of crystallisation seeds and, at the same time, a breaking-up of the crystals of the slurry. The formation of the seeds and the breaking-up of the crystals has the effect of increasing the number of crystallisation seeds and, consequently, of reducing the particle size of the crystals collected via the withdrawal device 8. Appropriate regulating of the speed of rotation of the shearing wheel 15, coupled with appropriate regulating of the speed of circulation of the crystal slurry in the crystallisation chamber, makes it possible to regulate, as desired, the particle size characteristics of the sodium carbonate monohydrate crystals withdrawn via the device 8.

Special features and details relating to the mode of operation of this application of the invention may be found in European Patent B-073085 (SOLVAY).

Figure 4:
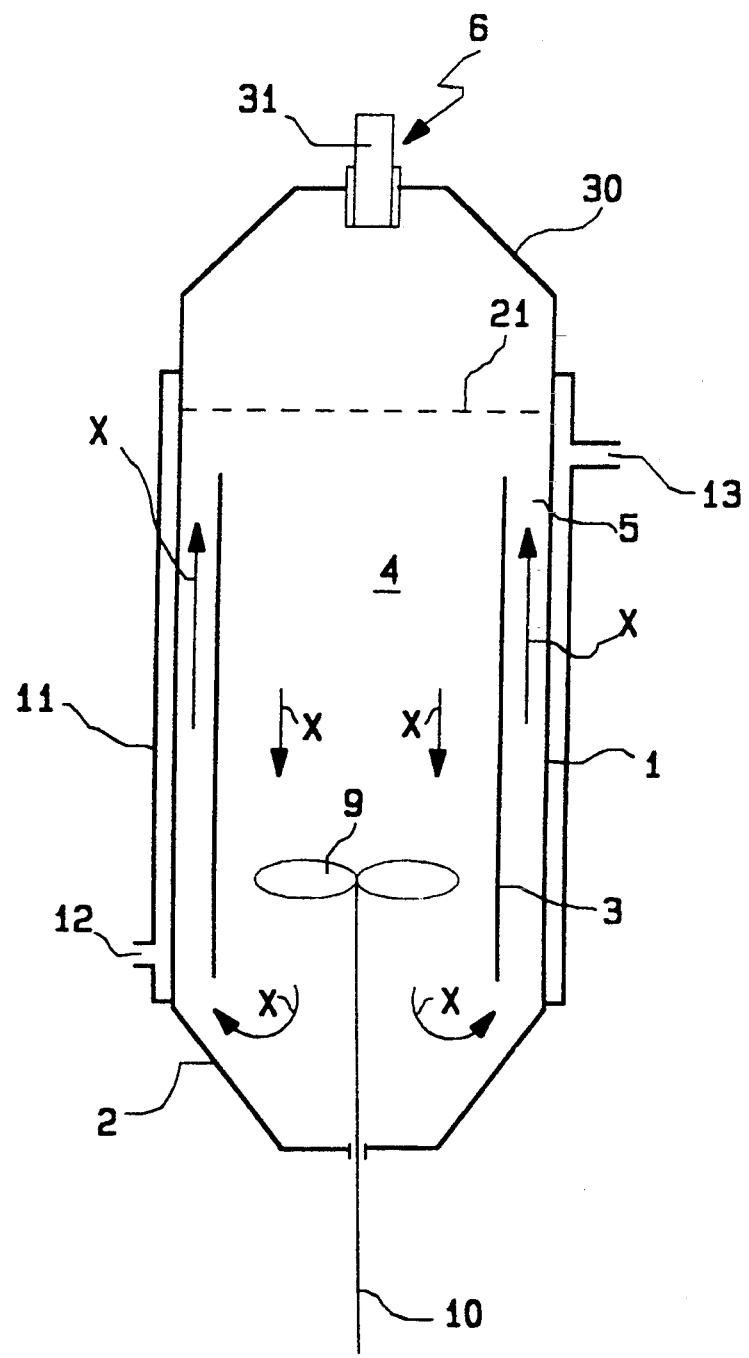
FIG. 4 is a view similar to that of FIG. 1 of a second embodiment of the installation according to the invention.
Figure 5:
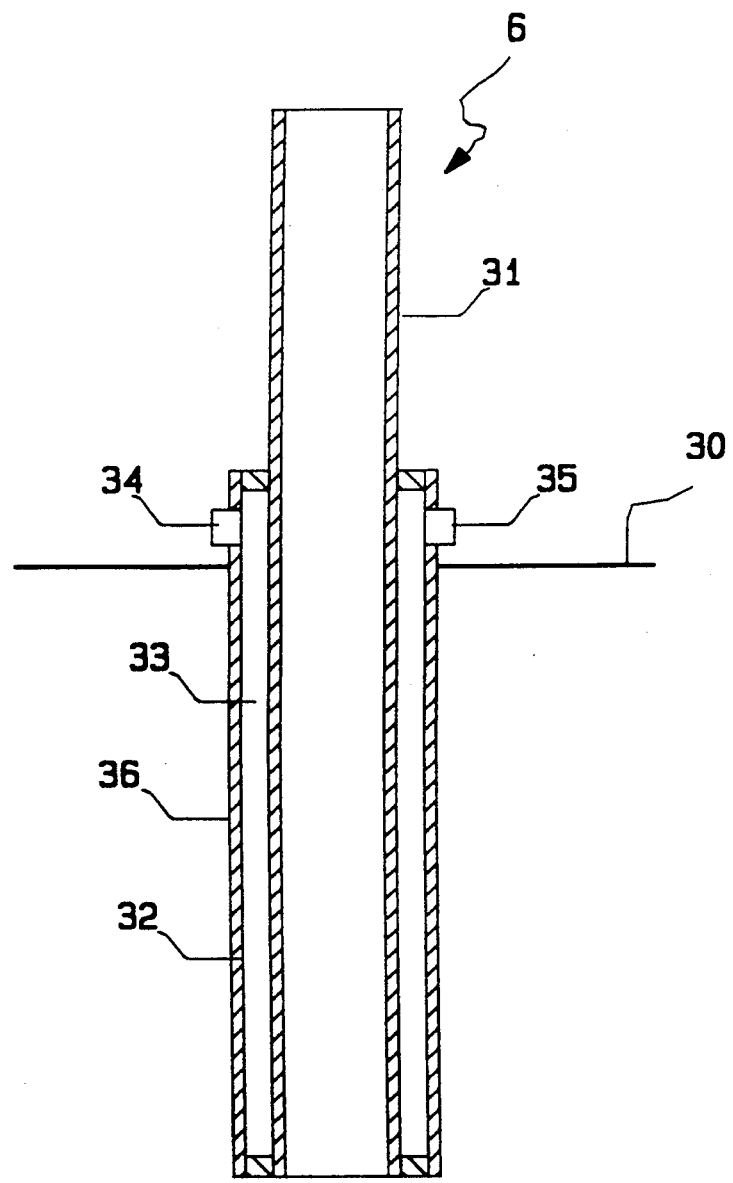
FIG. 5 shows a detail of FIG. 4 on a large scale.

The installation shown in FIGS. 4 and 5 is specially adapted to the crystallisation of sodium carbonate monohydrate, starting from anhydrous sodium carbonate. It comprises, like the installation in FIG. 1, a crystallisation chamber delimited by a vertical, cylindrical lateral wall 1, a frustoconical base 2 and a cover 30, a vertical cylindrical chimney 3 being arranged axially in the crystallisation chamber and thus dividing the latter into a central zone 4 and an annular zone 5.

The installation shown in FIG. 4 is special in respect of the means used to introduce the anhydrous sodium carbonate, in the form of a powder, into the crystallisation chamber. These means comprise a pipeline denoted in its entirety by the reference numeral 6, which passes through the cover 30 in alignment with the axis of the crystallisation chamber.

According to the invention, the pipeline 6, shown more clearly in FIG. 5, comprises a tube 31 which continues inside the crystallisation chamber, under the cover 30. The tube 31 extends approximately over the upper third of the height between the top of the cover 30 and the level 21 which the crystal slurry normally reaches during normal use of the installation. In the crystallisation chamber, the prolongation of the tube 31 is surrounded by an envelope 32 which delimits an annular chamber 33 around the tube 31. The chamber 33 is intended to be connected to a source of cold water via the nozzles 34 and 35.

The installation shown in FIG. 4 furthermore comprises a device for withdrawing a crystal slurry from the crystallisation chamber. This withdrawal device, which is not shown, is advantageously similar to the device 8 described above with reference to FIG. 1. The installation shown in FIG. 4 can, as a variant, also comprise a member for the mechanical shearing of the slurry, such as the shearing member 14 in FIG. 1.

During use of the installation of FIGS. 4 and 5, the crystallisation chamber is filled substantially up to the level 21 with an aqueous slurry of sodium carbonate monohydrate crystals, the temperature of which is permanently kept a few degrees below the temperature of the transition of sodium carbonate monohydrate to anhydrous sodium carbonate, so that the top space of the crystallisation chamber contains a substantial quantity of water vapour. The procedure followed is as described above with reference to FIGS. 1 to 3, anhydrous sodium carbonate being introduced into the crystallisation chamber via the pipeline 6. The circulation of the slurry in the crystallisation chamber causes turbulence in the atmosphere of the chamber, above the level 21, causing spraying of anhydrous sodium carbonate particles, some of which reach the envelope 32.

According to the invention, water is circulated in the annular chamber 33 via the pipelines 34 and 35. The temperature and flow rate of the water are chosen in accordance with the pressure and temperature conditions in the crystallisation chamber, so as to condense a sufficient quantity of water vapour on the external face 36 of the envelope 32 to form thereon a film of water capable of immediately dissolving the anhydrous sodium carbonate particles which arrive there. The aqueous sodium carbonate solution thus produced on the face 36 flows under gravity over the latter and falls into the slurry.

The application of the invention which has just been described is suitable for the production of dense anhydrous sodium carbonate (usually referred to as dense soda) from light anhydrous sodium carbonate (usually referred to as light soda) (Te-Pang Hou, Manufacture of Soda, Second Edition, Hafner Publishing Company, New York, 1969, pages 257 and 261). To this effect, the anhydrous sodium carbonate employed is light sodium carbonate and the sodium carbonate monohydrate crystals collected from the slurry are subjected to drying followed by calcination at a temperature above the temperature of the transition of sodium carbonate monohydrate to anhydrous sodium carbonate.

What is claimed is:

1. An apparatus for crystallisation of an inorganic substance in a crystal slurry, by desupersaturation of a supersaturated solution, the apparatus comprising a crystallisation chamber and a circulation device to bring about circulation of the slurry in the crystallisation chamber, the crystallisation chamber including a member for mechanical shearing of the slurry, comprising a disc provided with a ring of shearing teeth on its periphery.

2. The apparatus according to claim 1, wherein the shearing teeth are arranged symmetrically on either side of the disc.

3. The apparatus according to claim 2, wherein the teeth point at right angles to the disc.

4. The apparatus according to claim 1, wherein the disc is arranged in the crystallisation chamber so that the circulation of the crystal slurry in the crystallisation chamber exhibits a component tangential to the disc.

5. The apparatus according to claim 1, wherein the crystallisation chamber is delimited by a vertical cylindrical enclosure and is divided into a central zone and an annular zone by a cylindrical chimney arranged axially in the enclosure and open at its upper and lower ends, and said circulation of the slurry in the crystallisation chamber comprises a vertical translation in the central zone and a vertical translation in the opposite direction in the annular zone.

6. The apparatus according to claim 5, wherein the disc is arranged under a chimney.

7. The apparatus according to claim 5, including a device for withdrawing the slurry comprising a tube which opens into the central zone or the annular zone of the vertical cylindrical enclosure.

8. The apparatus according to claim 7, wherein the tube opens into the middle part of the zones.

9. The apparatus according to claim 8, wherein the tube opens into the upper half of the middle part of the zones.

10. The apparatus according to claim 7, wherein the zone into which the tube opens is the central zone.

11. The apparatus according to claim 10, wherein the tube runs in the annular zone and opens into the central zone across the chimney.

12. The apparatus according to claim 11, wherein the tube runs vertically in the annular zone of the crystallisation chamber and passes through the enclosure.

13. The apparatus according to claim 7, wherein the tube communicates with a degassing tube.

14. The apparatus according to claim 5, wherein the circulation of the slurry in the crystallisation chamber comprises a descending translation in the central zone and an ascending translation in the annular zone.

15. The apparatus according to claim 14, including a device for bringing about circulation of slurry in the crystallisation chamber comprising a helix of the axial flow type, arranged axially in the lower part of the central zone.

16. The apparatus according to claim 1, wherein the shearing teeth are arranged so that the shearing disc does not cause an overall radial or axial movement of the slurry relative to the axis of the shearing disc.

17. An apparatus for the crystallisation of sodium carbonate monohydrate, comprising a crystallisation chamber delimited by a lateral wall, a base and a cover through which passes a tube which serves for the introduction of anhydrous sodium carbonate, and a device designed to bring about a circulation of a slurry of sodium carbonate monohydrate crystals in the crystallisation chamber, the tube having a prolongation inside the crystallisation chamber and including, in a hollow wall of the said prolongation, an annular enclosure which communicates with an inlet pipeline and a discharge pipeline for a cooling fluid.

18. The apparatus according to claim 17, wherein the tube passes vertically through the cover.

* * * * *